United States Patent
Luo et al.

(10) Patent No.: US 7,564,183 B2
(45) Date of Patent: Jul. 21, 2009

(54) ORGANIC ELECTROLUMINESCENT DISPLAY PANEL WITH DUMMY AREAS

(75) Inventors: Tzeng-Cherng Luo, Hukou Township, Hsinchu County (TW); Cheng-Fan Lin, Hukou Township, Hsinchu County (TW); Meng-Chieh Liao, Hukou Township, Hsinchu County (TW); Chi-Chung Chen, Hukou Township, Hsinchu County (TW); Kang Chen, Hukou Township, Hsinchu County (TW)

(73) Assignee: Ritdisplay Corporation, Hsinchu County (TW)

( * ) Notice: Subject to any disclaimer, the term of this patent is extended or adjusted under 35 U.S.C. 154(b) by 512 days.

(21) Appl. No.: 11/443,051

(22) Filed: May 31, 2006

(65) Prior Publication Data

US 2006/0273711 A1 Dec. 7, 2006

(30) Foreign Application Priority Data

Jun. 2, 2005 (TW) ............................... 94118151 A

(51) Int. Cl.
*H01J 1/62* (2006.01)
*H01J 63/04* (2006.01)

(52) U.S. Cl. ...................... 313/504; 313/501; 313/506; 313/512

(58) Field of Classification Search .......... 313/498–512
See application file for complete search history.

(56) References Cited

U.S. PATENT DOCUMENTS

2004/0004214 A1* 1/2004 Yamazaki et al. ............. 257/40
2004/0207312 A1* 10/2004 Takashima et al. .......... 313/503
2005/0258441 A1* 11/2005 Shitagami .................... 257/88

* cited by examiner

*Primary Examiner*—Karabi Guharay
*Assistant Examiner*—Kevin Quarterman
(74) *Attorney, Agent, or Firm*—Bacon & Thomas, PLLC

(57) ABSTRACT

An organic electroluminescent display panel, which comprises a substrate, at least one display structure area, at least one first dummy area, and at least one second dummy area. The display structure area comprises at least one encapsulation area, at least one pixel area, a first conducting area, a second conducting area, a wiring area, a first connecting area, and a second connecting area. The wiring area and the first dummy area connect the first connecting area, and the two conducting areas and the second dummy area connect the second connecting area. Besides, the first and the second connecting areas overlap a selected part of the encapsulation area of a neighboring display structure area. Accordingly, the number and capacity of display structure areas on the organic electroluminescent display panel are increased to obtain a uniform brightness during a lighting test.

43 Claims, 4 Drawing Sheets

ORGANIC ELECTROLUMINESCENT DISPLAY PANEL WITH DUMMY AREAS

BACKGROUND OF THE INVENTION

1. Field of the Invention

The invention relates to a technical field of display panels and, more particularly, to an organic electroluminescent display panel.

2. Description of Related Art

Organic electroluminescent display (ELD) panels have the advantages of self-illumination, no restriction on viewing angle, low power consumption, simple process, low cost, wide range of operating temperatures, high response speed and full colorization and accordingly can become dominant among new-generation plat panel displays.

An organic ELD panel typically uses the self-illuminating feature of organic functional materials to obtain a display effect. Upon the different molecular weights, there are two types of displays, small molecule organic light-emitting display (SM-OLED) and polymer light-emitting display (PLED).

FIG. 1 is a schematic view of a typical organic electroluminescent display panel. As shown in FIG. 1, the typical panel includes a substrate 1 and at least one display structure area 2. The display structure has a pixel area 10 in an encapsulation area 11, first and second conducting areas 91 and 92 below the pixel area 10. The first conducting area 91 locates in between the second conducting areas 92. Besides, a first contact area 71 is below the first conducting area 91, and a second contact area 72 is below the second conducting areas 92 respectively. A voltage is applied to the first and the second contact areas 71 and 72 for lighting the panel to take an electrical test. Thus, the uniform brightness can be obtained in such a way during the lighting test. However, the first and the second contact area 71 and 72 require a large area so as to reduce the number of display structure areas 2 arranged on the substrate 1. Further, after the substrate 1 is segmented, the leads of the first and the second conducting area 91 and 92 are used to wire to one or more ICs (not shown), which require certain lengths. Thus, in the typical panel, the first and the second contact areas 71 and 72 are partially embedded into the encapsulation area 11 of a neighboring display structure area. Accordingly, the required areas on the substrate for the first and the second contact areas 71 and 72 are reduced, and the number and capacity of display structure areas are increased. However, such a way relatively reduces partial contact areas on the first and the second contact areas 71 and 72. In this case, the voltage applied to the first and the second contact areas 71 and 72 can easily contact a single lead, which causes a bright line 100. In addition, even the first and the second contact areas 71 and 72 are partially embedded into the encapsulation area 11 of the neighboring display structure area, their partial areas are provided for contacting the voltage during an electrical test. Thus, the number of display structure areas is increased restrictedly.

In general, the processing cost is reduced with increasing the number of display structure areas on a same panel size. However, as the partial areas on the first and the second contact areas 71 and 72 are reserved for the electrical test, the number of display structure areas 2 is certainly reduced to thus increase the processing cost.

Therefore, it is desirable to provide an improved panel to mitigate and/or obviate the aforementioned problems.

SUMMARY OF THE INVENTION

The object of the invention is to provide an organic electroluminescent display panel, which can increase the number and capacity of display structure areas on the organic electroluminescent display panel and obtain the uniform brightness during a lighting test.

To achieve the object, an organic electroluminescent display panel is provided. The panel includes a substrate, at least one display structure area, at least one first dummy area, and at least one second dummy area. The display structure area comprises at least one encapsulation area, at least one pixel area, a first conducting area, a second conducting area, a wiring area, and at least one connecting area.

To achieve the object, an organic electroluminescent display panel is provided. The panel includes a substrate, at least one display structure area, at least one first dummy area, and at least one second dummy area. The display structure area comprises at least one encapsulation area, at least one pixel area, a first conducting area, a second conducting area, a wiring area, a first connecting area and a second connecting area. The first dummy area and the wiring area connect the first connecting area, and the second dummy area, the first conducting area and the second conducting area connect the second connecting area.

To achieve the object, an organic electroluminescent display panel is provided. The panel includes a substrate, at least one display structure area, at least one first dummy area, at least one second dummy area and at least one third dummy area. The display structure area comprises at least one encapsulation area, at least one pixel area, a first conducting area, a second conducting area, a wiring area, a first connecting area, a second connecting area and a third connecting area. The first dummy area and the wiring area connect the first connecting area, the second dummy area and the second conducting area connect the second connecting area, and the third dummy area and the first conducting area connect the third connecting area.

Briefly, the invention arranges the dummy areas and the conducting areas on a same side of the pixel area in a horizontal direction, such that the panel is lighted through the dummy areas for test. In addition, as compared to the prior art, the invention embeds the connecting areas into the encapsulation area of a neighboring display structure area to thereby reduce the required areas on the panel for the electrical test, obtain a uniform brightness when the panel is lighted, and relatively increase the number of display structure areas arranged on the panel.

Other objects, advantages, and novel features of the invention will become more apparent from the following detailed description when taken in conjunction with the accompanying drawings.

DETAILED DESCRIPTION OF THE PREFERRED EMBODIMENT

First Embodiment

Figure 1:
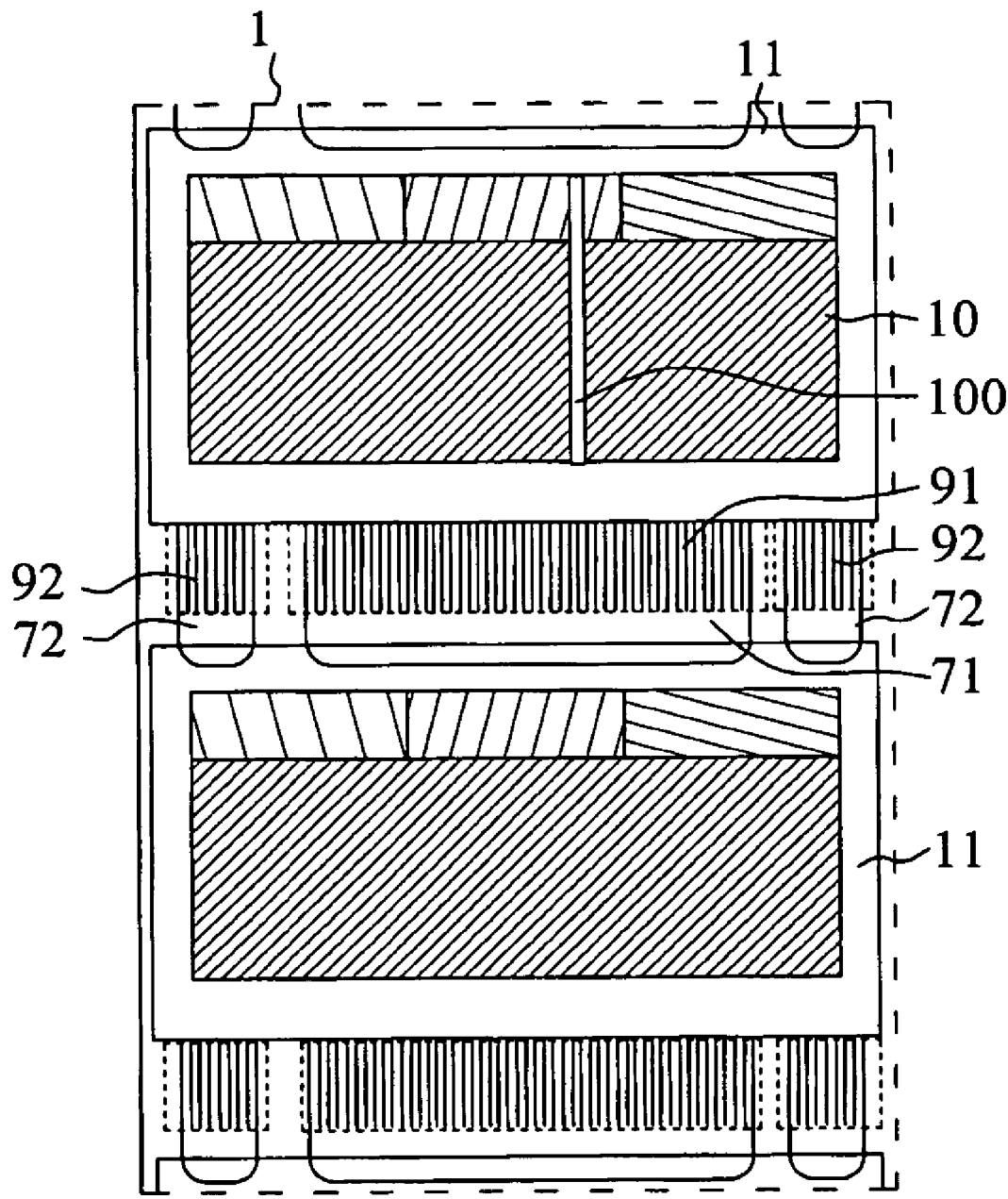
FIG. 1 is a schematic view of a typical organic electrolluminescent display panel.
Figure 2:
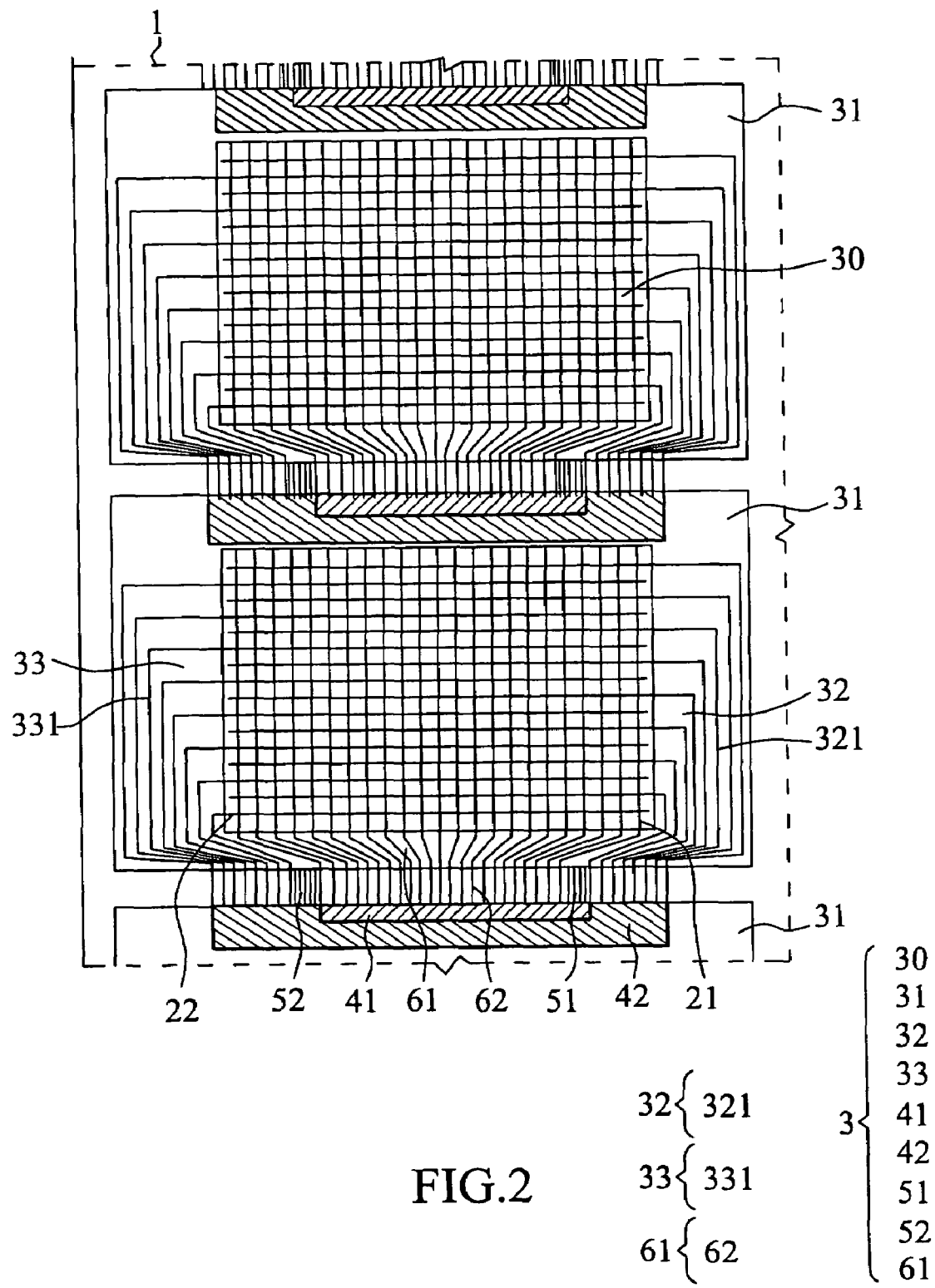
FIG. 2 is a schematic view of an embodiment of an organic electroluminescent display panel according to the invention.

FIG. 2 shows a layout of an organic electroluminescent display panel according to a preferred embodiment of the invention. As shown in FIG. 2, the panel includes a substrate 1, at least one display structure area 3, at least one first dummy area 51, and at least one second dummy area 52. The display structure area 3 includes at least one encapsulation area 31, at least one pixel area 30, a first conducting area 32, a second conducting area 33, a wiring area 61, a first connecting area 41, and a second connecting area 42. The first dummy area 51 and the wiring area 61 connect the first connecting area 41. The second dummy area 52, the first conducting area 32 and the second conducting area 33 connect the second connecting area 42.

The display structure area 3 further includes multiple wires 62, multiple first electrode lines 21, multiple second electrode lines 22, multiple first leads 321, and multiple second leads 331. The wires 62 are implemented in the wiring area 61 in parallel. The first electrode lines are implemented in the pixel area 30 and connects the wires in a one-to-one manner. The first connecting area 41 is implemented in the encapsulation area 31 of a neighboring display structure area 3 to thereby place the wiring area 61 in between the first connecting area 41 and the pixel area 30. The first connecting area 41 also connects the wires 62 and the first dummy area 51. The first leads 321 are implemented in the first conducting area 32 in parallel. The second leads 331 are implemented in the second conducting area 33 in parallel. The first and the second leads 321 and 331 are not intersected. The second electrode lines 22 are implemented in the pixel area 30, with some connecting the first leads 321 and the remainder connecting the second leads 331 in a one-to-one manner. The second connecting area 42 is implemented in the encapsulation area 31 of the neighboring display structure area 3 and connects the second dummy area 52.

In the panel, the first and the second dummy areas 51 and 52 can be implemented on any location. Preferably, the first and the second dummy areas 51 and 52 locate on the respective positions between the first and the second conducting areas 32 and 33, or the first dummy area 51 locates on a position between the wiring area 61 and the first conducting area 32, and the second dummy area 52 locates on a position between the wiring area 61 and the second conducting area 33.

Accordingly, a voltage applied to the first dummy area 51 can be provided to the wiring area 61 through the first connecting area 41. Similarly, a voltage applied to the second dummy area 52 can be provided to the first and the second conducting areas 32 and 33 through the second connecting area 42. Therefore, the panel in this embodiment can provide the respective voltages to the first and the second dummy areas 51 and 52 for an electrical test, such as the lighting, aging or current leakage test. In addition, the voltages respectively provided to the first and the second dummy areas 51 and 52 can also reach to the wires 62 of the wiring area 61, the first leads 321 of the first conducting area 32, and the second leads 331 of the second conducting area 33, so as to eliminate the problems of bright line generation or non-uniform brightness.

In this embodiment, the first or second connecting area 41 or 42 overlaps the encapsulation area 31 of the neighboring display structure area 3 so as to reduce the areas of the substrate 1 occupied by the first and the second connecting areas 41 and 42. Thus, the number of display structure areas 3 arranged on the panel is increased.

In this embodiment, overlapping the first and the second connecting areas 41 and 42 does not impact on the electrical test because the electrical test is performed on the first and the second dummy areas 51 and 52, which function as a contact. In this case, when the voltage is applied to the first and the second dummy areas 51 and 52, the display structure areas 3 can be lighted as usual. Namely, the number and capacity of display structure areas 3 arranged on the panel can be increased, and the panel can be lighted for the electrical test without a bright line.

After the panel is divided into multiple display structure areas 3, the encapsulation area 31 of each display structure area 3 includes the first and the second connecting areas 41 and 42 of a neighboring display structure area, and sometimes a few of the first leads 321, the second leads 331 or the wires 62.

In this embodiment, the first and the second dummy areas 51 and 52 can by any shape, and preferably a strip and/or lump shape. The first and second conducting areas 32 and 33, the first and second dummy areas 51 and 52, and the first and second connecting areas 41 and 42 respectively contain a metal oxide selected from a group consisting of indium tin oxide (ITO), oxides of aluminum and zinc, oxides of indium and zinc, and oxides of cadmium and tin, or a conductor material selected from a group consisting of aluminum, calcium, magnesium, indium, tin, manganese, copper, silver, gold and an alloy thereof, wherein the alloy includes an Mg-contained alloy of magnesium-silver alloy, magnesium-indium alloy, magnesium-tin alloy, magnesium-antimony alloy or magnesium-tellurium alloy.

Second Embodiment

Figure 3:
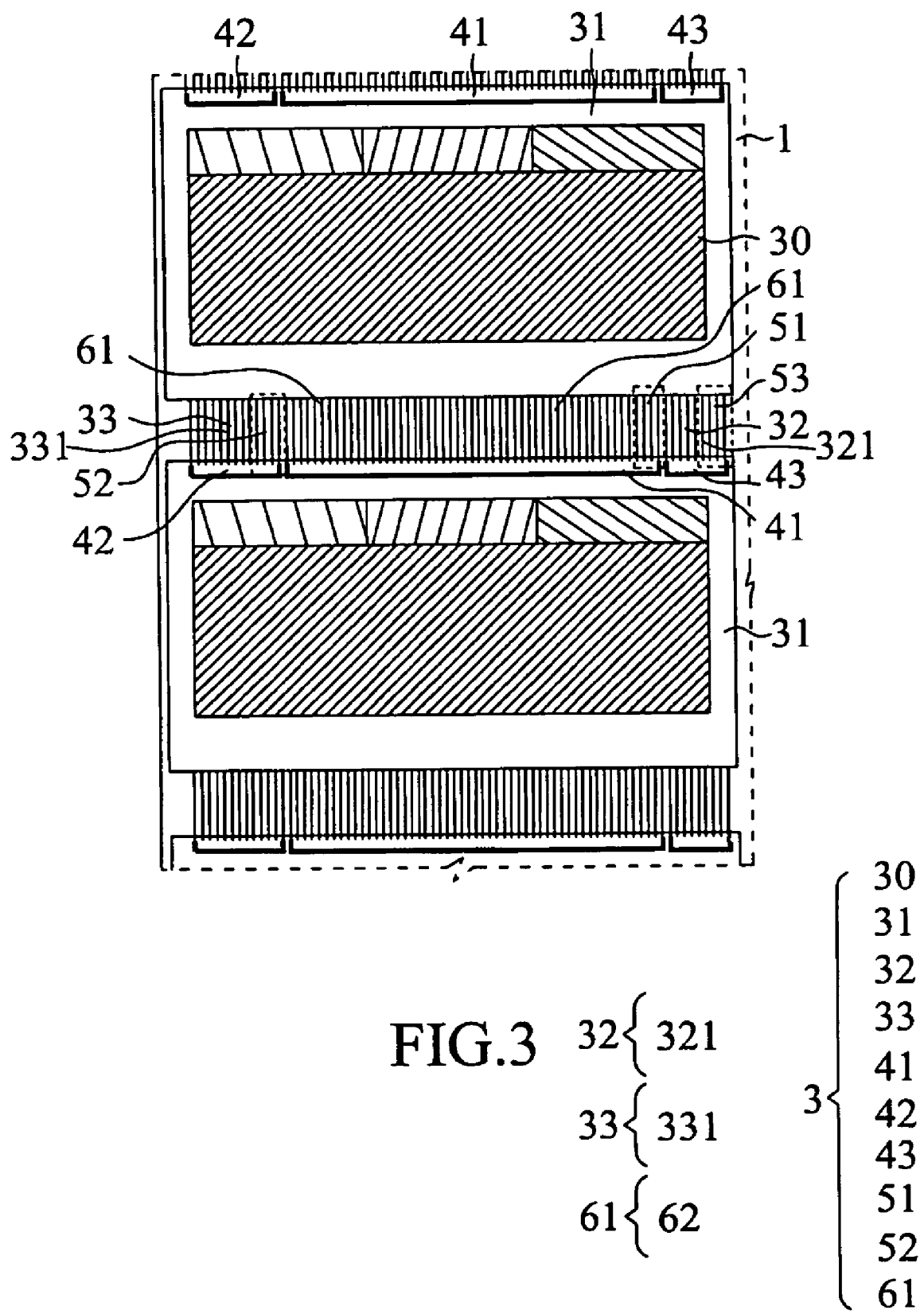
FIG. 3 is a schematic view of another embodiment of an organic electroluminescent display panel according to the invention.

FIG. 3 is a schematic view of another preferred embodiment of an organic electroluminescent display panel according to the invention.

As shown in FIG. 3, the panel includes a substrate 1, at least one display structure area 51, at least one first dummy area 52, at least one second dummy area 52 and at least one third dummy area 53. The display structure area 3 comprises at least one encapsulation area 31, at least one pixel area 30, a first conducting area 32, a second conducting area 33, a wiring area 61, a first connecting area 41, a second connecting area 42 and a third connecting area 43. The first dummy area 51 and the wiring area 61 connect the first connecting area 41, the second dummy area 52 and the second conducting area 33 connect the second connecting area 42, and the third dummy area 53 and the first conducting area 32 connects the third connecting area 43.

In this embodiment, the first, the second and the third dummy areas 51, 52 and 53 can by any shape, and preferably a strip and/or lump shape. The first and second conducting areas 32 and 33, the first to third dummy areas 51, 52 and 53, and the first to third connecting areas 41, 42 and 43 respectively contain a metal oxide selected from a group consisting of indium tin oxide (ITO), oxides of aluminum and zinc, oxides of indium and zinc and oxides of cadmium and tin, or a conductor material selected from a group consisting of aluminum, calcium, magnesium, indium, tin, manganese, copper, silver, gold and an alloy thereof, wherein the alloy includes an Mg-contained alloy of magnesium-silver alloy, magnesium-indium alloy, magnesium-tin alloy, magnesium-antimony alloy or magnesium-tellurium alloy.

In this embodiment, the arrangement is the same as that in the first embodiment except that the first leads 321 of the first conducting area 32 on one lateral connect the third dummy area 53 and the third connecting area 43 and the second leads 331 of the second conducing area 33 on the other lateral connect the second dummy area 52 and the second connecting area 42, and not repeated any more.

Accordingly, the first, the second and the third dummy areas 51, 52 and 53 function as a contact of a test voltage to light the pixel area 30 without the problem of non-uniform brightness. In addition, in this embodiment, the first to third connecting areas 41, 42 and 43 overlap the encapsulation area 31 of the display structure area 3 to thus increase the number and capacity of display structure areas 3 arrange on the panel.

After the panel is divided into multiple display structure areas 3, the encapsulation area 31 of each display structure area 3 includes the first to third connecting areas 41, 42 and 43 of a neighboring display structure area, and sometimes a few of the first leads 321, the second leads 331 or the wires 62.

Third Embodiment

Figure 4:
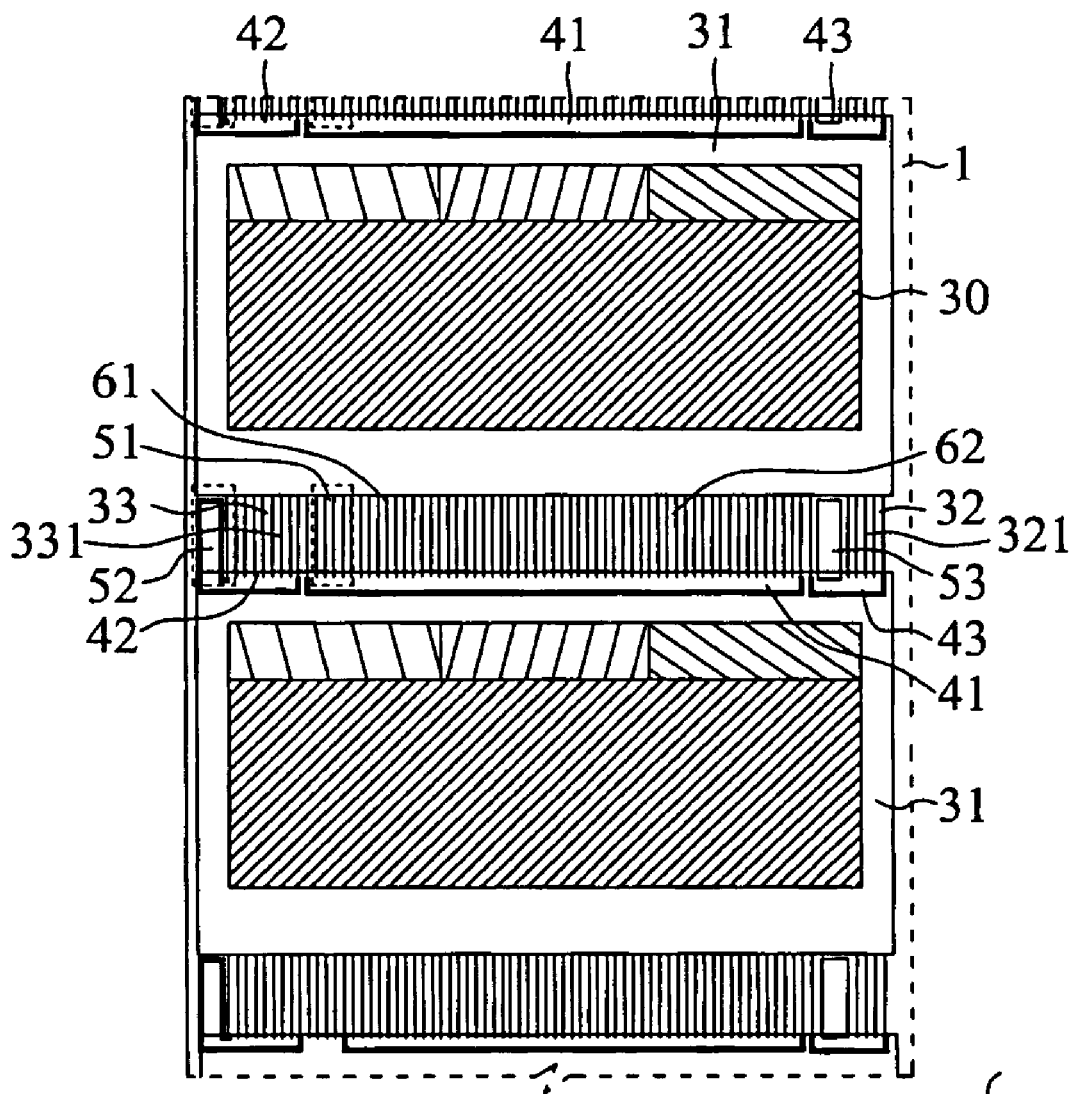
FIG. 4 is a schematic view of a further embodiment of an organic electroluminescent display panel according to the invention.

FIG. 4 is a schematic view of a further preferred embodiment of an organic electroluminescent display panel according to the invention.

In this embodiment, the arrangement is the same as that in the second embodiment except that the dummy areas 51-53 can be a lump and/or strip shape and are arranged on the changed positions due to the changed input positions of the respective test voltages for the lighting test, and not repeated any more.

In this embodiment, the dummy areas 51, 52 and 53 function as a contact area to light the pixel area 30 when the respective voltages are applied, which has no the problem of non-uniform brightness. In addition, the first to third connecting areas 41, 42 and 43 overlap the encapsulation area 31 of the display structure area 3 to thus increase the number and capacity of display structure areas 3 arrange on the panel.

After the panel is divided into multiple display structure areas 3, the encapsulation area 31 of each display structure area 3 includes the connecting areas 41, 42 and 43 of a neighboring display structure area, or a few of the wires 62, the first leads 321, the second leads 331, the first dummy area 51, the second dummy area 52 and/or the third dummy area 53.

Although the present invention has been explained in relation to its preferred embodiment, it is to be understood that many other possible modifications and variations can be made without departing from the spirit and scope of the invention as hereinafter claimed.

What is claimed is:

1. An organic electroluminescent display panel, comprising:
a substrate;
at least one display structure area, which has at least one encapsulation area, at least one pixel area, a first conducting area, a second conducting area, a wiring area, a first connecting area and a second connecting area;
at least one first dummy area, which connects the first connecting area along with the wiring area;
at least one second dummy area, which connects the second connecting area along with the first conducting area and the second conducting and
the first dummy area is implemented between the wiring area and the first conducting area, and the second dummy area is implemented between the wiring area and the second conducting area.

2. The panel as claimed in claim 1, further comprising multiple wires implemented in the wiring area in parallel.

3. The panel as claimed in claim 2, further comprising multiple first electrode lines implemented in the pixel area and connecting the wires in a one-to-one manner.

4. The panel as claimed in claim 2, wherein the first connecting area connects the wires and the first dummy area.

5. The panel as claimed in claim 1, further comprising multiple second electrode lines implemented in the pixel area in parallel.

6. The panel as claimed in claim 5, further comprising multiple first leads implemented in the first conducting area and multiple second leads implemented in the second conducting area, wherein the first leads and the second leads are not intersected.

7. The panel as claimed in claim 6, wherein the second electrode lines connects the first and the second leads respectively, in a one-to-one manner.

8. The panel as claimed in claim 1, wherein the second connecting area is implemented in one side of the encapsulation area of a neighboring display structure area in a horizontal direction, and connects the second dummy area.

9. The panel as claimed in claim 1, wherein the first or second dummy area is a strip shape.

10. The panel as claimed in claim 1, wherein the first and the second dummy areas are a lump shape.

11. The panel as claimed in claim 1, wherein the first conducting area, the second conducting area, the first dummy area, the second dummy area, the first connecting area and the second connecting area respectively contain a metal oxide or a conductor material.

12. The panel as claimed in claim 11, wherein the metal oxide is one or more selected from a group consisting of indium tin oxide (ITO), oxides of aluminum and zinc, oxides of indium and zinc, and oxides of cadmium and tin.

13. The panel as claimed in claim 11, wherein the conductor material is one or more selected from a group consisting of aluminum, calcium, magnesium, indium, tin, manganese, copper, silver, gold and an alloy thereof.

14. The panel as claimed in claim 13, wherein the alloy comprises an Mg-contained alloy of magnesium-silver alloy, magnesium-indium alloy, magnesium-tin alloy, magnesium-antimony alloy or magnesium-tellurium alloy.

15. An organic electroluminescent display panel, comprising:
a substrate;
at least one display structure area, which has at least one encapsulation area, at least one pixel area, a first conducting area, a second conducting area, a wiring area, a first connecting area, a second connecting area and a third connecting area; at least one first dummy area, which connects the first connecting area along with the wiring area;
at least one second dummy area, which connects the second connecting area along with the second conducting area; and
at least one third dummy area, which connect the third connecting area along with the first conducting area.

16. The panel as claimed in claim 15, further comprising multiple wires implemented in the wiring area in parallel.

17. The panel as claimed in claim 15, further comprising multiple first electrode lines implemented in the pixel area and connecting the wires in a one-to-one manner.

18. The panel as claimed in claim 15, wherein the first connecting area connects the wires and the first dummy area.

19. The panel as claimed in claim 15, further comprising multiple second electrode lines implemented in the pixel area in parallel.

20. The panel as claimed in claim 19, further comprising multiple first leads implemented in the first conducting area and multiple second leads implemented in the second conducting area, wherein the first leads and the second leads are not intersected.

21. The panel as claimed in claim 20, wherein the second electrode lines connects the first and the second leads respectively, in a one-to-one manner.

22. The panel as claimed in claim 15, wherein the second connecting area is implemented in one side of the encapsulation area of a neighboring display structure area in a horizontal direction, and connects the second dummy area.

23. The panel as claimed in claim 22, wherein the third conducting area is implemented in the other side of the encapsulation area of the neighboring display structure area in the horizontal direction, and connects the third dummy area.

24. The panel as claimed in claim 15, wherein the first, second or third dummy area is a strip shape.

25. The panel as claimed in claim 15, wherein the first, second or third dummy area is a lump shape.

26. The panel as claimed in claim 15, wherein the first conducting area, the second conducting area, the first dummy area, the second dummy area, the third dummy area, the first connecting area, the second connecting area and the third connecting area respectively contain a metal oxide or a conductor material.

27. The panel as claimed in claim 26, wherein the metal oxide is one or more selected from a group consisting of indium tin oxide (ITO), oxides of aluminum and zinc, oxides of indium and zinc, and oxides of cadmium and tin.

28. The panel as claimed in claim 26, wherein the conductor material is one or more selected from a group consisting of aluminum, calcium, magnesium, indium, tin, manganese, copper, silver, gold and an alloy thereof.

29. The panel as claimed in claim 28, wherein the alloy comprises an Mg-contained alloy of magnesium-silver alloy, magnesium-indium alloy, magnesium-tin alloy, magnesium-antimony alloy or magnesium-tellurium alloy.

30. An organic electroluminescent display panel, comprising:
   a substrate;
   at least one display structure area, which has at least one encapsulation area, at least one pixel area, a first conducting area, a second conducting area, a wiring area and at least one connecting area;
   at least one dummy; and
   the connecting area comprises a first connecting area and a second connecting area and the dummy area comprises a first dummy area connecting the first connecting area along with the wiring area, and a second dummy area connecting the second connecting area along with the first conducting area and the second conducting area.

31. The panel as claimed in claim 30, further comprising multiple wires implemented in the wiring area in parallel.

32. The panel as claimed in claim 31, further comprising multiple first electrode lines implemented in the pixel area and connecting the wires in a one-to-one manner.

33. The panel as claimed in claim 30, further comprising multiple second electrode lines implemented in the pixel area in parallel.

34. The panel as claimed in claim 33, further comprising multiple first leads implemented in the first conducting area and multiple second leads implemented in the second conducting area, wherein the first leads and the second leads are not intersected.

35. The panel as claimed in claim 34, wherein the second electrode lines connects the first and the second leads respectively, in a one-to-one manner.

36. The panel as claimed in claim 30, wherein the connecting area further comprises a third connecting area.

37. The panel as claimed in claim 36, wherein the dummy area comprises at least one first dummy area connecting the first connecting area along with the wiring area, at least one second dummy area connecting the second connecting area along with the second conducting area, and at least one third dummy area connecting the third connecting area along with the first conducting area.

38. The panel as claimed in claim 30, wherein the dummy area is a strip shape.

39. The panel as claimed in claim 30, wherein the dummy areas is a lump shape.

40. The panel as claimed in claim 34, wherein the first conducting area, the second conducting area, the dummy area and the connecting area respectively contain a metal oxide or a conductor material.

41. The panel as claimed in claim 40, wherein the metal oxide is one or more selected from a group consisting of indium tin oxide (ITO), oxides of aluminum and zinc, oxides of indium and zinc, and oxides of cadmium and tin.

42. The panel as claimed in claim 40, wherein the conductor material is one or more selected from a group consisting of aluminum, calcium, magnesium, indium, tin, manganese, copper, silver, gold and an alloy thereof.

43. The panel as claimed in claim 42, wherein the alloy comprises an Mg-contained alloy of magnesium-silver alloy, magnesium-indium alloy, magnesium-tin alloy, magnesium-antimony alloy or magnesium-tellurium alloy.

* * * * *